United States Patent
Hsu et al.

(10) Patent No.: US 10,431,400 B2
(45) Date of Patent: Oct. 1, 2019

(54) PROGRAM SWITCH AND MODULAR PROGRAM SWITCH ARRANGEMENT FOR MOUNTING ON A PRINTED CIRCUIT BOARD AND METHOD FOR PRODUCING SUCH A PROGRAM SWITCH ARRANGEMENT

(71) Applicant: Würth Elektronik eiSos GmbH & Co. KG, Waldenburg (DE)

(72) Inventors: Mei-Ting Hsu, Ilan (TW); Alexander Gerfer, Odenthal (DE)

(73) Assignee: Würth Elektronik eiSos GmbH & Co. KG, Waldenburg (DE)

( * ) Notice: Subject to any disclaimer, the term of this patent is extended or adjusted under 35 U.S.C. 154(b) by 0 days.

(21) Appl. No.: 15/877,698

(22) Filed: Jan. 23, 2018

(65) Prior Publication Data

US 2018/0211797 A1    Jul. 26, 2018

(30) Foreign Application Priority Data

Jan. 24, 2017 (EP) ..................... 17152865

(51) Int. Cl.
| | |
|---|---|
| *H01H 9/26* | (2006.01) |
| *H01H 1/58* | (2006.01) |
| *H01H 11/00* | (2006.01) |
| *H01H 15/00* | (2006.01) |
| *H05K 1/18* | (2006.01) |

(52) U.S. Cl.
CPC ............ *H01H 9/26* (2013.01); *H01H 1/5805* (2013.01); *H01H 11/00* (2013.01); *H01H 15/005* (2013.01); *H01H 2223/054* (2013.01); *H05K 1/184* (2013.01); *H05K 2201/10053* (2013.01)

(58) Field of Classification Search
CPC ........ H01H 9/26; H01H 1/5805; H01H 11/00; H01H 15/005; H01H 2223/054; H05K 1/184; H05K 2201/10053
USPC .......................................... 200/5 A
See application file for complete search history.

(56) References Cited

U.S. PATENT DOCUMENTS

| | | | |
|---|---|---|---|
| 3,985,981 A | 10/1976 | Weirick et al. | |
| 4,425,018 A * | 1/1984 | Stenz ................... | H01R 9/2408 439/716 |
| 4,497,985 A | 2/1985 | Courter et al. | |
| 6,332,813 B1 * | 12/2001 | Okabe .................. | H01R 13/514 439/541.5 |
| 7,459,647 B2 | 12/2008 | Liu | |
| 7,462,063 B1 * | 12/2008 | Correll ................. | H01R 9/2416 439/460 |

(Continued)

FOREIGN PATENT DOCUMENTS

| | | |
|---|---|---|
| DE | 77 31 652 U1 | 1/1978 |
| DE | 34 26 949 A1 | 1/1986 |

(Continued)

*Primary Examiner* — Edwin A. Leon
(74) *Attorney, Agent, or Firm* — McGlew and Tuttle, P.C.

(57) ABSTRACT

The invention relates to a program switch for mounting on a printed circuit board comprising a housing, an insulator component with contact elements arranged thereon, and a switching element for contacting the contact elements. The housing has at least two connection elements for connecting the program switch to adjacent program switches to form a program switch arrangement having an arbitrary number of poles. Production and stock keeping and sale of the program switch are simple.

22 Claims, 5 Drawing Sheets

(56) References Cited

U.S. PATENT DOCUMENTS

| | | | |
|---|---|---|---|
| 7,585,183 B2* | 9/2009 | Shimazu | H01H 11/0018 |
| | | | 439/530 |
| 7,753,740 B2* | 7/2010 | Carolis | H01R 9/2408 |
| | | | 439/717 |
| 9,882,324 B2* | 1/2018 | Shi | H01R 24/84 |

FOREIGN PATENT DOCUMENTS

| | | |
|---|---|---|
| TW | 2008 20300 A | 5/2008 |
| TW | 2012 16315 A | 4/2012 |

* cited by examiner

PROGRAM SWITCH AND MODULAR PROGRAM SWITCH ARRANGEMENT FOR MOUNTING ON A PRINTED CIRCUIT BOARD AND METHOD FOR PRODUCING SUCH A PROGRAM SWITCH ARRANGEMENT

CROSS-REFERENCE TO RELATED APPLICATIONS

This patent application claims priority of European Patent Application Serial No. EP 17 152 865.6 filed on Jan. 24, 2017, pursuant to 35 U.S.C. 119(a)-(d), the content of which is incorporated herein by reference in its entirety as if fully set forth herein.

FIELD OF THE INVENTION

The invention relates to a program switch and a modular program switch arrangement for mounting on a printed circuit board. The invention furthermore relates to a method for producing such a program switch arrangement.

BACKGROUND OF THE INVENTION

Program switches for mounting on a printed circuit board, in particular program switches embodied as DIP switches (DIP: Dual In-Line Package), are known in many cases from prior public use. Such program switches are embodied here as a unit having a predefined number of switches or poles. Dedicated program switches exist for each number of poles, as a result of which dedicated production tools and separate stock keeping are required for each number of poles. This results in high costs during production. Furthermore, additional costs arise in particular during storage and sale of known program switches having different numbers of poles.

SUMMARY OF THE INVENTION

The invention is based on the object of providing a program switch which enables cost-effective production and also simple storage and simple sale.

This object is achieved by means of a program switch for mounting on a printed circuit board, comprising a housing, an insulator component with contact elements arranged thereon, and a switching element for contacting the contact elements, wherein the housing has at least two connection elements for connection to adjacent program switches. In contrast to the known program switches, the program switch according to the invention is embodied with one pole and comprises a housing having at least two connection elements. The at least two connection elements serve for connecting the program switch to adjacent program switches. It has been recognized according to the invention that it is disadvantageous to produce program switches as a unit having predefined numbers of poles and to provide different production tools for each number of poles. The program switch according to the invention is embodied as a one-pole module. It thus comprises, besides the housing and the at least two connection elements, exactly one insulator component with exactly two contact elements arranged thereon, and exactly one switching element for contacting the exactly two contact elements. The program switch is embodied as a module and is connectable by means of the at least two connection elements to adjacent program switches to form a modular program switch arrangement having an arbitrary number of poles. As a result of this, firstly, a reduction of the production costs is achieved and, secondly, a program switch is provided which is universally usable for all numbers of poles of a program switch arrangement, as a result of which, in particular, storage and sale are simplified.

Advantageously, the program switch comprises at least one male connection element and at least one female connection element for positively locking connection to adjacent program switches. In this case, male connection elements serve for plugging into female connection elements, while female connection elements are designed to receive male connection elements. As a result of such a configuration of the connection elements, merely one configuration of the program switch according to the invention is necessary in order to connect the program switch to adjacent program switches. The at least two connection elements form undercuts, as a result of which a mechanical positively locking connection of the program switch to adjacent program switches is made possible. In order to form the undercuts, a cross-sectional area of the connection elements is embodied such that it is, in particular, trapezium-shaped, advantageously symmetrically trapezium-shaped. In particular, the acute angles of symmetrically trapezium-shaped connection elements are between 25° and 75°, in particular between 35° and 65°, advantageously exactly 45°. The corners of the connection elements may be rounded for production engineering reasons.

Alternatively, the program switch may comprise only male connection elements or only female connection elements, such that two types of program switches according to the invention are necessary in order to produce a modular program switch arrangement.

The housing has a top side, an underside and also four side walls, in particular two short and two long side walls. The long side walls are designated as first and second side walls. An opening for introducing the insulator component is formed at the underside. The connection elements are formed in particular on the first side wall and on the second side wall of the housing. In particular, the at least two connection elements on the side walls, proceeding from the underside, can extend over the entire height of the respective side wall. Advantageously, the connection elements extend over a partial height of the respective side wall, in particular between one third and two thirds of the height of the respective side wall, and form a mounting stop.

The contact elements define a plug-in direction of the program switch on the printed circuit board. The program switch is electrically conductively connected to the printed circuit board by means of the contact elements. The switching element can assume an on or an off switching position. In the on switching position, the switching element presses the contact elements against one another. Accordingly, the contact is interrupted in the off switching position of the contact elements. Advantageously, the housing has an inscription that identifies the on position and the off position of the switching element. Advantageously, the inscription is provided on the top side of the housing.

In particular, the connection between the program switch and adjacent program switches can be embodied in a force-locking manner and/or in a positively locking manner A program switch configured such that the at least two connection elements thereof for connection to the adjacent program switches are embodied in a positively locking manner enables particularly simple production.

A program switch configured such that the contact elements thereof define a plug-in direction of the program switch into the printed circuit board and the at least two connection elements for connection are free of undercuts in the plug-in direction enables particularly simple production. By virtue of the fact that the at least two connection elements are free of undercuts in the plug-in direction, a program switch can be connected to further program switches to form a program switch arrangement in a simple and automative manner.

A program switch configured such that at least one connection element thereof is embodied as projection and at least one connection element thereof is embodied as cutout ensures simple production. The projection forms a male connection element and the cutout forms a female connection element.

A program switch configured such that the housing thereof has a first side wall and a second side wall, wherein at least one connection element is arranged on each of these side walls, ensures simple production. By virtue of the fact that at least one connection element is arranged on the first and the second side wall, the program switch is connectable to an adjacent program switch to form a program switch arrangement in a simple manner The at least two connection elements preferably extend along a partial region of the respective side wall and in each case form a mounting stop. The connection elements are embodied in a manner free of undercuts up to the mounting stop. The at least two connection elements extend in particular on the side walls proceeding from an underside of the housing, such that, during the production of a program switch arrangement, the at least one connection element of an adjacent program switch is insertable into the associated connection element and is displaceable as far as the mounting stop.

A program switch configured such that each side wall thereof has exactly one connection element, which is arranged centrally on the respective side wall, enables particularly simple production. The exactly one connection element on the respective side wall enables a sufficiently stable connection to an associated connection element of an adjacent program switch in a simple manner.

A program switch configured such that each side wall thereof has two connection elements spaced apart from one another enables an increased connection strength when the program switch is connected to adjacent program switches. Preferably, the connection elements are spaced apart transversely with respect to a plug-in direction of the program switch. The two connection elements of the respective side wall can be embodied identically or differently. By way of example, the connection elements of one of the side walls can be embodied exclusively as male connection elements and the connection elements of the other side wall exclusively as female connection elements. Alternatively, each side wall can have a male connection element and a female connection element.

A program switch configured such that an inner side of the housing is embodied in such a way that the insulator component is positioned in a defined manner in the housing ensures simple and reliable introduction of the insulator component into the housing and thus simple production. The fact that the inner side of the housing is embodied in such a way that the insulator component is positioned in a defined manner in the housing ensures that the switching element is assigned unambiguously to the respective switching position. In particular, forming a projection or a groove on the inner side of the housing ensures that the correspondingly complementarily shaped insulator component can be positioned in a defined manner in the housing. By way of example, the projection or the groove is formed centrally and only on the inner side of a side wall. By way of example, the housing has a chamfer at the connection point of two side walls, as a result of which the correspondingly complementarily chamfered insulator component is positioned in a defined manner in the housing.

The invention is furthermore based on the object of providing a program switch arrangement having an arbitrary number of poles in a simple manner.

This object is achieved by means of a modular program switch arrangement for mounting on a printed circuit board comprising at least two program switches according to the invention, wherein a program switch is connected to an adjacent program switch by means of the connection elements. The advantages of the program switch arrangement according to the invention correspond to the already described advantages of the program switch according to the invention. The program switch arrangement is individually preassembled prior to mounting on the printed circuit board. In this case, the number of individual program switches defines the number of poles of the program switch arrangement. The program switch arrangement is thus constructed modularly from the individual program switches. The program switches are connected to one another in a force-locking manner and/or in a positively locking manner by means of the connection elements. Since the connection elements of the respective program switches are embodied complementarily in such a way that the program switches of the modular program switch arrangement in the connected state bear against the side walls thereof, the customary pitch of 2.54 mm between the contact elements of adjacent program switches is complied with.

A modular program switch arrangement configured such that the positively locking connection is embodied as a dovetail connection ensures a positively locking connection between adjacent program switches in a simple manner. The dovetail connection runs in a plug-in direction or transversely with respect to a plug-in direction of the program switches.

The invention is furthermore based on the object of providing a method for producing a modular program switch arrangement.

This object is achieved by means of a method comprising the steps of providing at least two program switches according to the invention, and connecting the program switches to form a modular program switch arrangement by means of the connection elements. The advantages of the method according to the invention correspond to the already described advantages of the program switch according to the invention and/or of the program switch arrangement according to the invention.

A method according to which a further program switch is connected to at least one free connection element of an outer program switch of the modular program switch arrangement ensures the production of a modular program switch arrangement having an arbitrary number of poles. A further program switch is mountable onto the respective at least one free connection element in a simple manner A respective terminating program switch may have at least one connection element in each case only on one side wall for aesthetic reasons, such that the outer side wall is smooth. The modular program switch arrangement then has the visual impression of a known program switch embodied as a unit.

Further features, advantages and details of the invention are evident from the following description of the exemplary embodiments.

DESCRIPTION OF THE PREFERRED EMBODIMENTS

Figure 1:
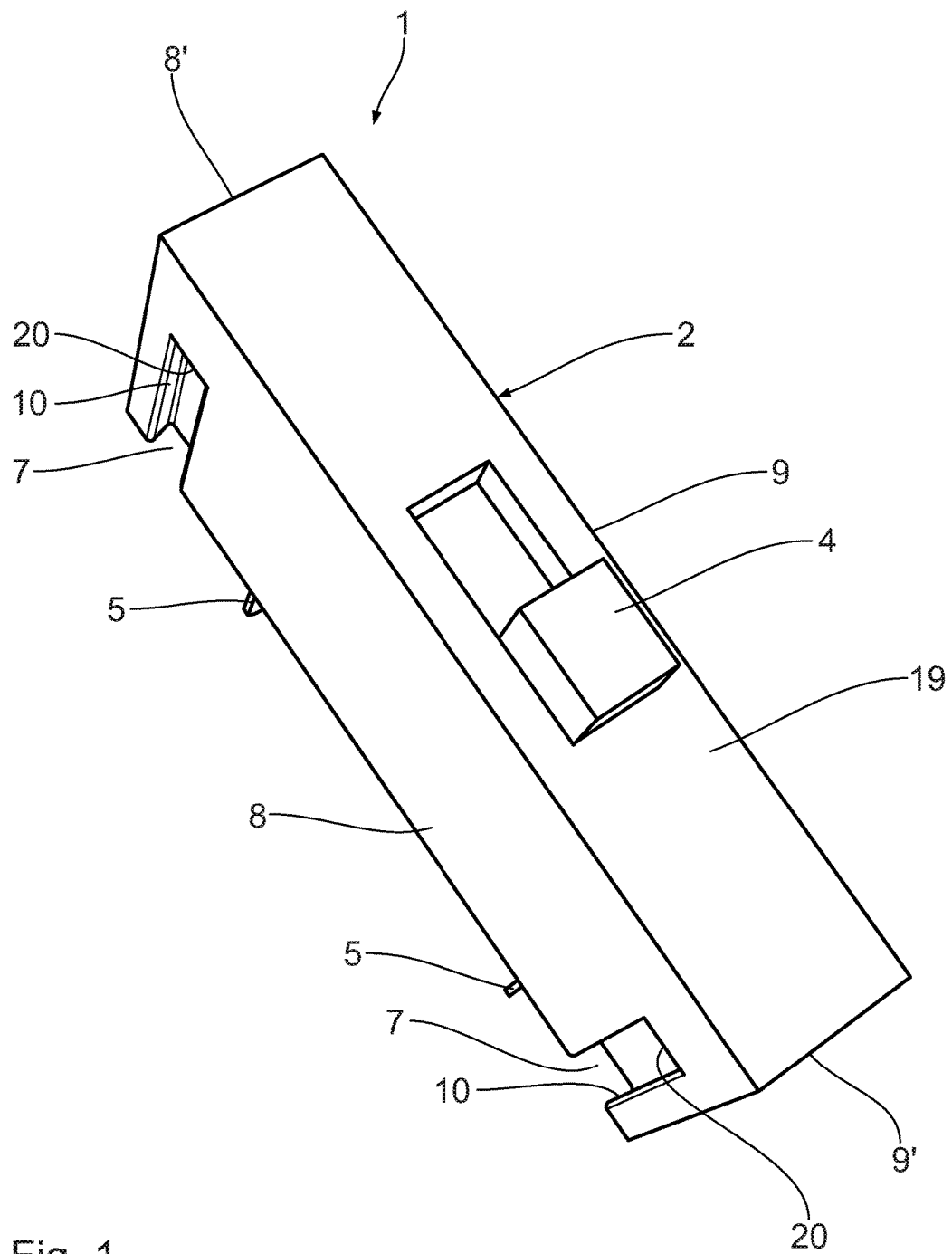
FIG. 1 shows a first perspective illustration of a program switch according to the invention in accordance with a first exemplary embodiment.
Figure 2:
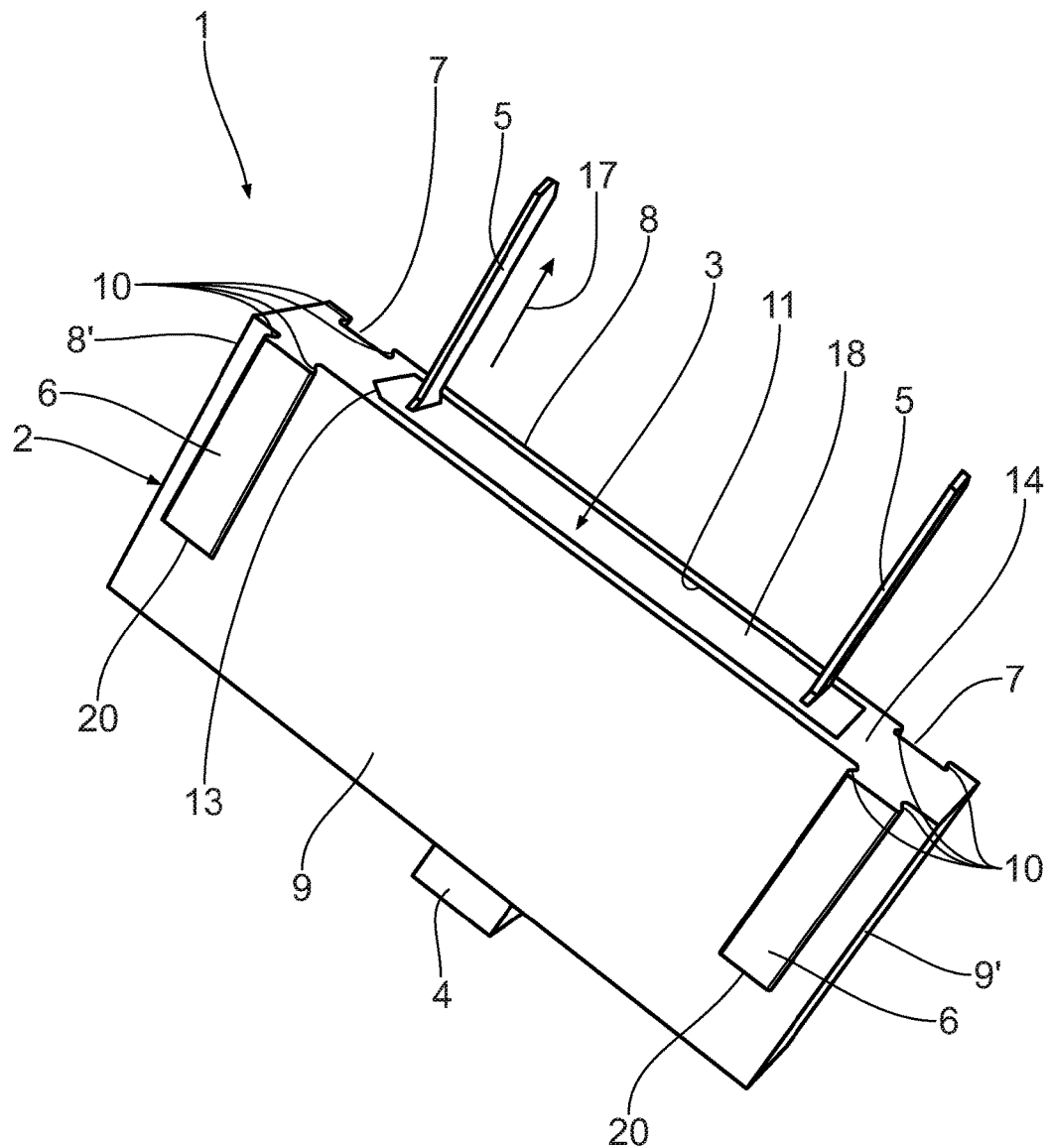
FIG. 2 shows a second perspective illustration of the program switch in FIG. 1.

FIGS. 1 and 2 show a first exemplary embodiment of the program switch 1 according to the invention. The program switch 1 comprises a housing 2, in which a switching element 4 and an insulator component 3 are incorporated. Two contact elements 5 are arranged on the insulator component 3. In this case, the contact elements 5 define a plug-in direction 17 of the program switch 1 into a printed circuit board. The printed circuit board is not illustrated, for reasons of clarity.

The housing 2 comprises two long side walls 8, 9, which hereinafter are also designated as first side wall 8 and second side wall 9, and two short side walls 8', 9', which connect the side walls 8, 9 to one another. An opening 18 for introducing the insulator component 3 is formed at an underside 14 of the housing 2. At a top side, the housing 2 has a cover wall 19, which connects the side walls 8, 8', 9, 9' to one another and through which the switching element 4 is led in sections for the purpose of actuation.

The switching element 4 serves for contacting the contact elements 5 and is movable between an on and an off switching position. In order to identify the on switching position or the off switching position of the program switch 1, the inscription "ON" and/or "OFF" may be provided on the housing 2. In the on switching position, the switching element 4 contacts the contact elements 5.

The first side wall 8 has two female connection elements 7, which are spaced apart transversely with respect to the plug-in direction 17 of the program switch 1. By contrast, the second side wall 9 has two male connection elements 6, which are correspondingly spaced apart transversely with respect to the plug-in direction 17 of the program switch 1. In this case, the connection elements 6 and 7, proceeding from the underside 14 of the housing 2, extend over roughly two thirds of the height of the housing 2 and have a symmetrically trapezium-shaped cross-sectional area. The acute angles of the cross-sectional area are 45° and are rounded. On account of their shape, the connection elements 6 and 7 form undercuts 10. The female connection elements 7 are embodied as cutout, whereas the male connection elements 6 are embodied as projection. In the plug-in direction 17, the connection elements 6, 7 are freely moveable to each other as far as movement is stopped by a mounting stop 20. An inner side 11 of the housing 2 and also the insulator component 3 have a chamfer 13, as a result of which the insulator component 3 is positioned unambiguously or in a defined manner in the housing 2.

Figure 3:
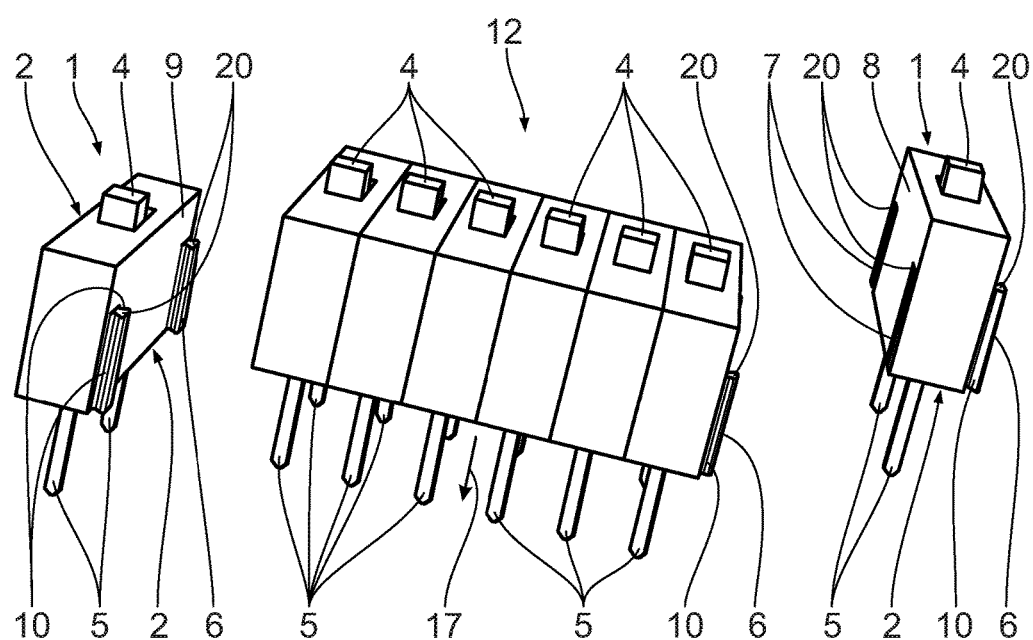
FIG. 3 shows a perspective illustration of a program switch arrangement according to the invention in accordance with the first exemplary embodiment.

The program switch 1 is embodied as a one-pole module, such that a modular program switch arrangement 12 having a desired number of poles is producible by the positively locking and force-locking connection of a plurality of program switches 1. FIG. 3 shows the modular program switch arrangement 12. In this case, the program switch arrangement 12 consists of a plurality of program switches 1 according to the invention, which are connected to one another in a positively locking and force-locking manner by means of the connection elements 6 and 7. Adjacent program switches 1 thus form a dovetail connection. By means of the number of program switches 1 connected in a positively locking and a force-locking manner, the program switch arrangement 12 is producible with an arbitrary number of poles. The program switch arrangement 12 is mounted on the printed circuit board in a customary manner by means of the contact elements 5. By virtue of the fact that the program switches 1 have two connection elements 6 and 7 on each side wall 8 and 9, the program switch arrangement 12 is extremely stable.

Figure 4:
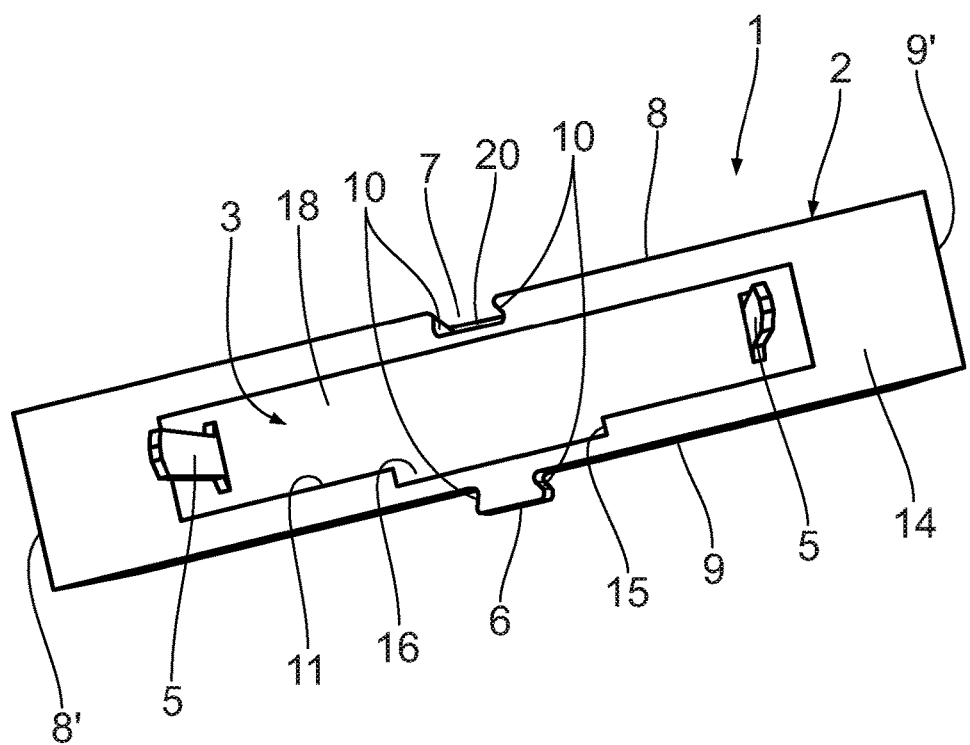
FIG. 4 shows a perspective illustration of a program switch according to the invention in accordance with a second exemplary embodiment.

A program switch 1 in accordance with a second embodiment is evident from FIG. 4. Structurally identical component parts have the same reference numerals as in the previous FIGS. 1 to 3. In the second exemplary embodiment, the first side wall 8 and the second side wall 9 in each case have centrally exactly one connection element 6, 7. In this case, a female connection element 7 is formed on the first side wall 8 and a male connection element 6 is formed on the second side wall 9. As in the first exemplary embodiment, the connection elements 6 and 7 proceeding from the underside 14 of the housing 2, extend over roughly two thirds of the height of the housing 2 and have a symmetrically trapezium-shaped cross-sectional area. In addition, the corners of the connection elements 6 and 7 are rounded or have any other shape. On account of their shape, the connection elements 6 and 7 form undercuts 10. However, the connection elements 6, 7 are embodied in a manner freely moveable to each other in the plug-in direction 17 as far as movement is stopped by the mounting stop 20.

The inner side 11 of the housing 2 has a groove 15. In this case, the groove 15 is formed centrally on the side wall 9. The insulator component 3 is formed complementarily to the groove 15 and has a projection 16 on a corresponding side surface. By means of the groove 15 and the projection 16, the insulator component 3 is positioned unambiguously or in a defined manner in the housing 2.

Figure 5:
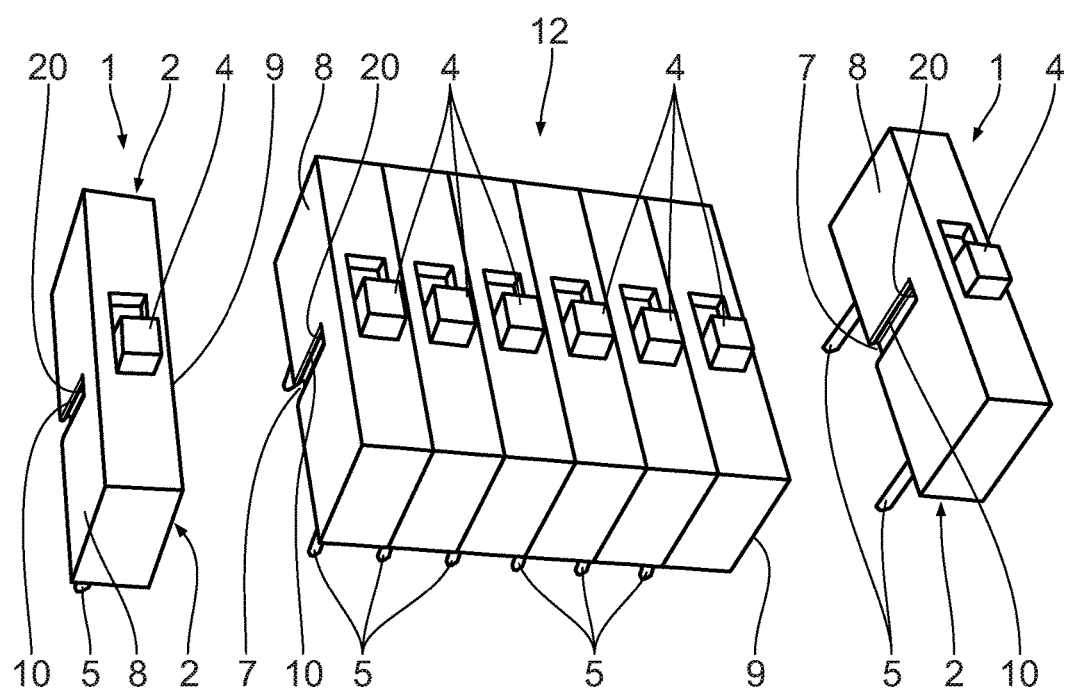
FIG. 5 shows a perspective illustration of a program switch arrangement according to the invention in accordance with the second exemplary embodiment.

FIG. 5 shows a program switch arrangement 12 comprising a plurality of program switches in accordance with the second exemplary embodiment. Adjacent program switches 1 are connected to one another in a positively locking and force-locking manner by means of the exactly one male connection element 6 and by means of the exactly one female connection element 7. With regard to the further construction and the further functioning, reference is made to the first exemplary embodiment.

The method for producing a modular program switch arrangement 12 is as follows:

At least two one-pole program switches 1 are connected to one another in a positively locking manner and in a force-locking manner by means of the connection elements 6 and 7 to form a modular program switch arrangement 12. In order to connect further program switches 1, the latter are connected to at least one free connection element 6 or 7 of an outer program switch 1 in the described manner By adding further program switches 1 by means of the connection elements 6 and 7, the modular program switch arrangement 12 is individually adaptable in terms of the number of poles.

What is claimed is:

1. A program switch for forming a modular program switch arrangement and for mounting on a printed circuit board, the program switch comprising:

a housing;
an insulator component with contact elements arranged thereon; and
a switching element movable between an on switching position and an off switching position and the switching element contacting the contact elements in the on switching position, wherein the housing has a first side wall and a second side wall and at least two connection elements are arranged on each side of the first side wall and the second side wall and spaced apart from each other for connection to adjacent program switches, wherein the at least two connection elements on each side wall are identical, wherein an inner side of the housing is embodied such that the insulator component is positioned in a defined manner in the housing such that the switching element is assigned unambiguously to the on switching position and the off switching position.

2. The program switch according to claim 1, wherein the two connection elements for connection to the adjacent program switches are embodied in a positively locking manner.

3. The program switch according to claim 1, wherein the contact elements define a plug-in direction of the program switch into the printed circuit board, and the two connection elements for connection are free of undercuts in the plug-in direction.

4. The program switch according to claim 1, wherein the connection elements of one of the side walls are embodied as projections and the connection elements of another one of the side walls are embodied as cutouts.

5. The program switch according to claim 1, wherein the inner side of the housing has one of a chamfer, a groove and a projection and the insulator component has another one of the chamfer, the groove and the projection.

6. A modular program switch arrangement for mounting on a printed circuit board, the modular program switch arrangement comprising:
at least two program switches, each of the at least two program switches comprising a housing, an insulator component with contact elements arranged thereon and a switching element movable between an on switching position and an off switching position and the switching element contacting the contact elements in the on switching position, wherein the housing has a first side wall and a second side wall and at least two connection elements are arranged on each side of the first side wall and the second side wall and spaced apart from each other, the at least two connection elements on each side wall being identical, wherein one of the at least two program switches is connected to an adjacent program switch by the connection elements, wherein an inner side of the housing is embodied such that the insulator component is positioned in a defined manner in the housing such that the switching element is assigned unambiguously to the on switching position and the off switching position.

7. The modular program switch arrangement according to claim 6, wherein the positively locking connection is embodied as a dovetail connection, wherein the inner side of the housing has one of a chamfer and a groove and the insulator component has a projection, insulator component being positioned in the housing via the projection and one of the chamber and the groove.

8. A method for producing a modular program switch arrangement, the method comprising the following steps:
providing at least two program switches, each of the at least two program switches comprising a housing, an insulator component with contact elements arranged thereon and a switching element movable between an on switching position and an off switching position and the switching element contacting the contact elements in the on switching position, wherein the housing has a first side wall and a second side wall and at least two connection elements are arranged on each side of the first side wall and the second side wall and spaced apart from each other, the at least two connection elements on each side wall being identical, wherein an inner side of the housing is embodied such that the insulator component is positioned in a defined manner in the housing such that the switching element is assigned unambiguously to the on switching position and the off switching position;
connecting the program switches to form a modular program switch arrangement by the connection elements.

9. The method according to claim 8, wherein a further program switch is connected to the free connection elements of an outer program switch of the modular program switch arrangement, wherein the inner side of the housing has one of a chamfer and a groove and the insulator component has a projection, insulator component being positioned in the housing via the projection and one of the chamber and the groove.

10. The method according to claim 8, wherein each of the at least two connection elements on the first side wall is different from each of the at least two connection elements on the second side wall, the housing having a third wall connecting the first side wall and the second side wall, the third wall comprising a third wall first surface and a third wall second surface located opposite the third wall first surface, at least the third wall first surface and the third wall second surface defining a slot, the switching element being arranged in the slot, the contact elements defining a plug-in direction of the program switch, the third wall first surface and the third wall second surface extending in a direction transverse to the plug-in direction.

11. The method according to claim 10, wherein each of the at least two connection elements on the first side wall is one of a slot and a projection, each of the at least two connection elements on the second side wall being another one of the slot and the projection.

12. The method according to claim 10, wherein the contact elements define a plug-in direction of the program switch, the slot and the projection extending in a direction parallel to the plug-in direction.

13. The method according to claim 8, wherein each of the at least two connection elements on the first side wall is one of a slot and a projection, each of the at least two connection elements on the second side wall being another one of the slot and the projection.

14. The program switch according to claim 1, wherein each of the at least two connection elements on the first side wall is different from each of the at least two connection elements on the second side wall.

15. The program switch according to claim 14, wherein each of the at least two connection elements on the first side wall is one of a slot and a projection, each of the at least two connection elements on the second side wall being another one of the slot and the projection.

16. The program switch according to claim 15, wherein the contact elements define a plug-in direction of the program switch, the slot and the projection extending in a direction parallel to the plug-in direction.

17. The program switch according to claim 1, wherein each of the at least two connection elements on the first side wall is one of a slot and a projection, each of the at least two connection elements on the second side wall being another one of the slot and the projection.

18. The modular program switch arrangement according to claim 6, wherein each of the at least two connection elements on the first side wall is different from each of the at least two connection elements on the second side wall.

19. The modular program switch arrangement according to claim 18, wherein each of the at least two connection elements on the first side wall is one of a slot and a projection, each of the at least two connection elements on the second side wall being another one of the slot and the projection.

20. The modular program switch arrangement according to claim 19, wherein the contact elements define a plug-in direction of the program switch, the slot and the projection extending in a direction parallel to the plug-in direction.

21. The program switch according to claim 1, wherein the program switch is embodied as a one-pole module.

22. A program switch according to claim 1, wherein the contact elements define a plug-in direction of the program switch and the switching element is movable transversely to the plug-in direction between the on switching position and the off switching position.

* * * * *